US008853052B2

(12) United States Patent
Huang et al.

(10) Patent No.: US 8,853,052 B2
(45) Date of Patent: Oct. 7, 2014

(54) METHOD OF MANUFACTURING A SEMICONDUCTOR DEVICE

(75) Inventors: Gin-Chen Huang, New Taipei (TW); Yi-An Lin, Taipei (TW); Ching-Hong Jiang, New Taipei (TW); Neng-Kuo Chen, Tainan County (TW); Sey-Ping Sun, Hsinchu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 419 days.

(21) Appl. No.: 13/204,352

(22) Filed: Aug. 5, 2011

(65) Prior Publication Data

US 2013/0034948 A1    Feb. 7, 2013

(51) Int. Cl.
*H01L 21/76* (2006.01)
*H01L 29/00* (2006.01)
*H01L 21/308* (2006.01)
*H01L 21/3105* (2006.01)
*H01L 21/762* (2006.01)

(52) U.S. Cl.
CPC ...... *H01L 21/76224* (2013.01); *H01L 21/3081* (2013.01); *H01L 21/31053* (2013.01); *H01L 21/31055* (2013.01)
USPC ............ 438/424; 438/435; 257/501; 257/510

(58) Field of Classification Search
USPC ................. 438/404, 424, 427, 428, 435, 437; 257/501, 506, 510
See application file for complete search history.

(56) References Cited

U.S. PATENT DOCUMENTS

| 6,586,804 B2 * | 7/2003 | Choi et al. ..................... 257/374 |
| 7,968,423 B2 * | 6/2011 | Choi .............................. 438/424 |
| 8,022,467 B2 * | 9/2011 | Iikawa et al. .................. 257/324 |
| 2004/0063300 A1 * | 4/2004 | Chi ................................ 438/425 |
| 2007/0020878 A1 * | 1/2007 | Nam ............................... 438/424 |
| 2011/0062546 A1 * | 3/2011 | Cheng et al. .................. 257/506 |

* cited by examiner

*Primary Examiner* — Hsien Ming Lee
(74) *Attorney, Agent, or Firm* — Haynes and Boone, LLP

(57) ABSTRACT

A method for fabricating a semiconductor device is disclosed. An exemplary method includes a providing substrate. A dielectric layer is formed over the semiconductor substrate and a stop layer is formed over the dielectric layer. The stop layer and the dielectric layer comprise a different material. The method further includes forming a patterned hard mask layer over the stop layer and etching the semiconductor substrate through the patterned hard mask layer to form a plurality of trenches. The method also includes depositing an isolation material on the semiconductor substrate and substantially filling the plurality of trenches. Thereafter, performing a CMP process on the semiconductor substrate, wherein the CMP process stops on the stop layer.

19 Claims, 20 Drawing Sheets

METHOD OF MANUFACTURING A SEMICONDUCTOR DEVICE

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, the semiconductor industry has experienced challenges in manufacturing field-effect transistors (FETs). Although methods of fabricating FET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
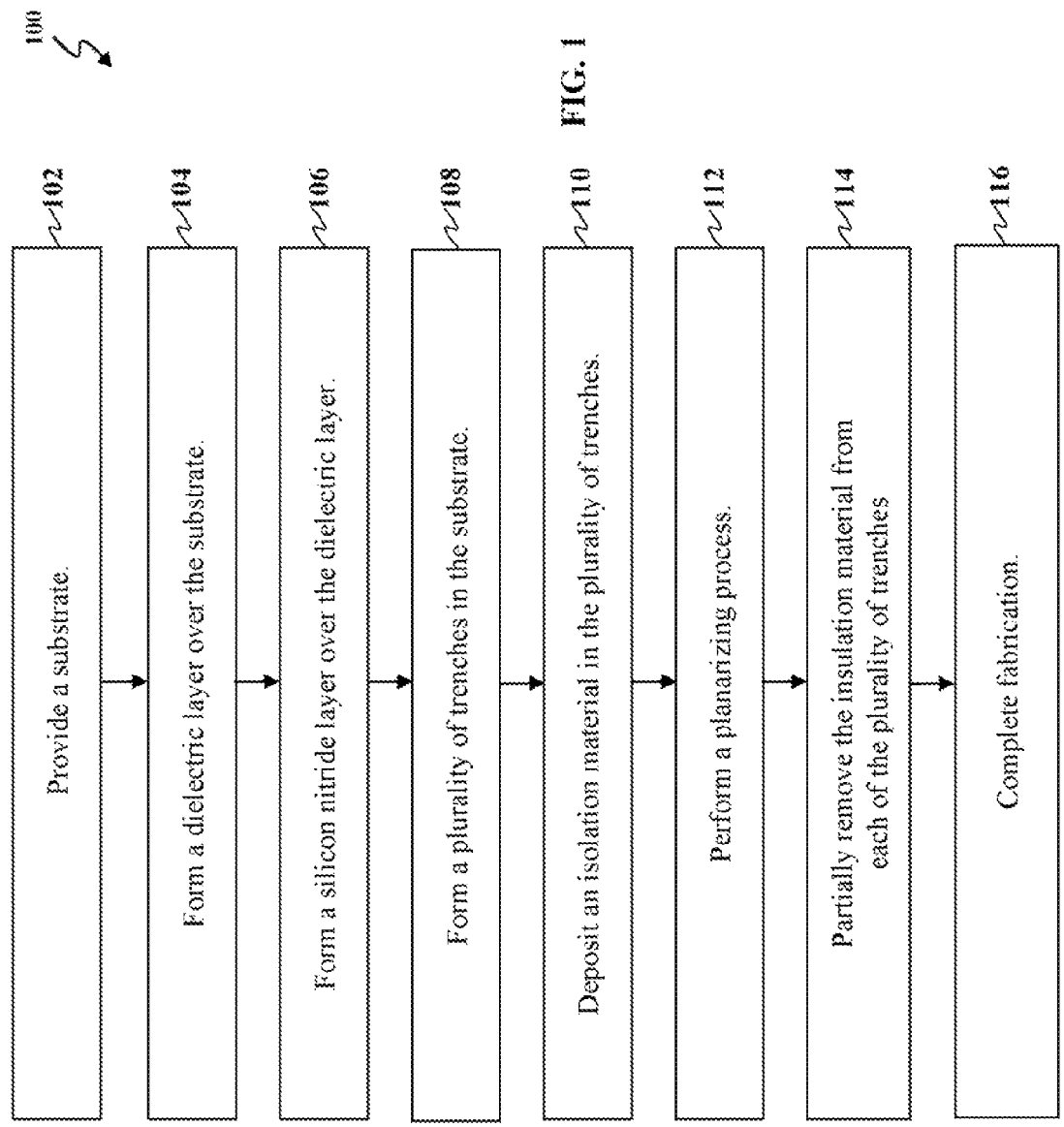
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a method 100 for fabricating a semiconductor device is described according to various aspects of the present disclosure. The method 100 begins with step 102 in which a substrate is provided. The method 100 continues with step 104 in which a dielectric layer is formed over the substrate. At step 106, a stop/hard mask layer is formed over the dielectric layer. The stop/hard mask layer is subsequently used as both a stop layer and a hard mask layer. At step 108, a plurality of trenches are formed in the substrate. The method 100 continues at step 110 in which an isolation material is deposited in the plurality of trenches. At step 112, a planarizing process is performed. At step 114, the isolation material is partially removed from each of the plurality of trenches. The method 100 continues at step 116 in which fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

Figure 2:
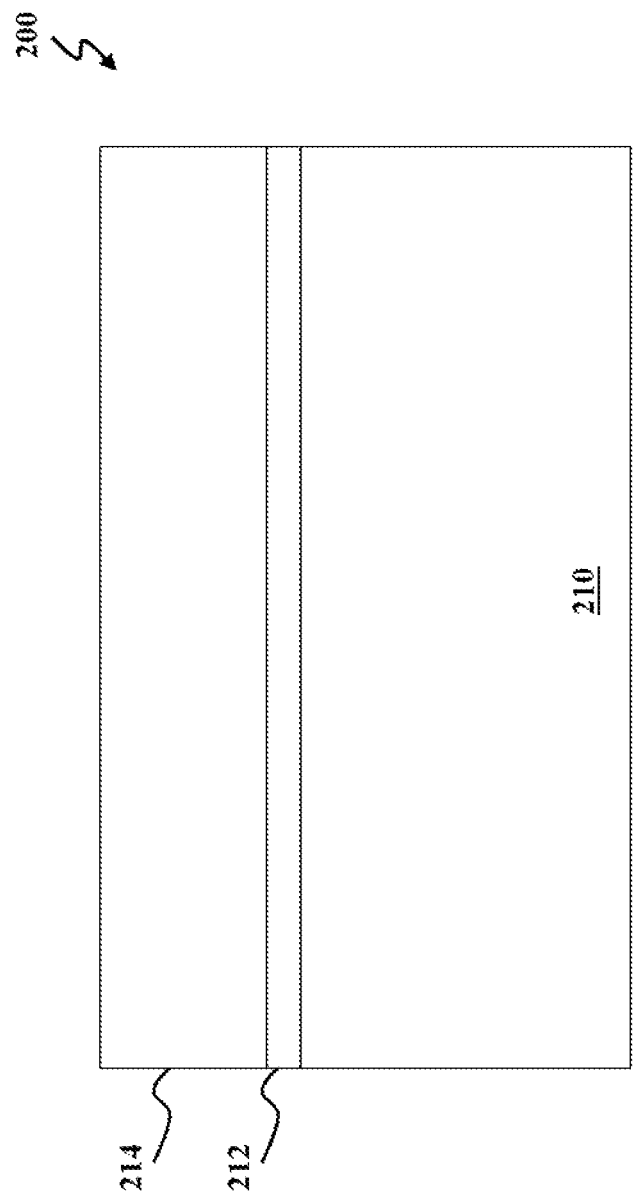
FIGS. 2 to 6 illustrate diagrammatic cross-sectional side views of one embodiment of a semiconductor device at various stages of fabrication according to the method of FIG. 1.

FIGS. 2 to 6 illustrate diagrammatic cross-sectional side views of one embodiment of a semiconductor device 200 at various stages of fabrication according to the method 100 of FIG. 1. Referring to FIG. 2, the semiconductor device 200 includes a substrate 210. In the present embodiment, the substrate 210 is a semiconductor substrate including silicon. In an example, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another example, the semiconductor substrate could be a semiconductor on insulator (SOI). The SOI substrate can be fabricated using separation by implantation of oxygen (SIMOX), wafer bonding, and/or other suitable methods.

The substrate 210 may include various doped regions and other suitable features. The doped regions may be doped with p-type dopants, such as boron or $BF_2$, and/or n-type dopants, such as phosphorus or arsenic. The doped regions may be formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

The semiconductor device 200 also includes a dielectric layer 212 formed over the substrate 210. The dielectric layer 212 is formed by any suitable process to any suitable thickness. For example, the dielectric layer 212 may be formed having a thickness greater than about 100 Angstroms. The dielectric layer 212 includes a dielectric material such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In the present embodiment, the dielectric layer 212 includes silicon oxide and is formed by a CVD or a thermal oxidation process. The thermal oxidation process may be a dry or a wet process. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Formed over the dielectric layer 214 is a stop/hard mask layer 214. The stop/hard mask layer 214 is used both as a etch hard mask and as a polish stop layer in subsequent processes. The stop/hard mask layer 214 is formed by any suitable process to any suitable thickness. For example, the stop/hard mask layer 214 may be formed having a thickness greater than about 100 Angstroms. The stop/hard mask layer 214 may include a material such as silicon nitride, silicon oxide, silicon oxynitride, silicon carbide, silicon carbon nitride, amorphous silicon, poly silicon, other suitable material, or combinations thereof. In the present embodiment, the stop/hard mask layer 214 includes silicon nitride and is formed by a CVD process. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Figure 3:
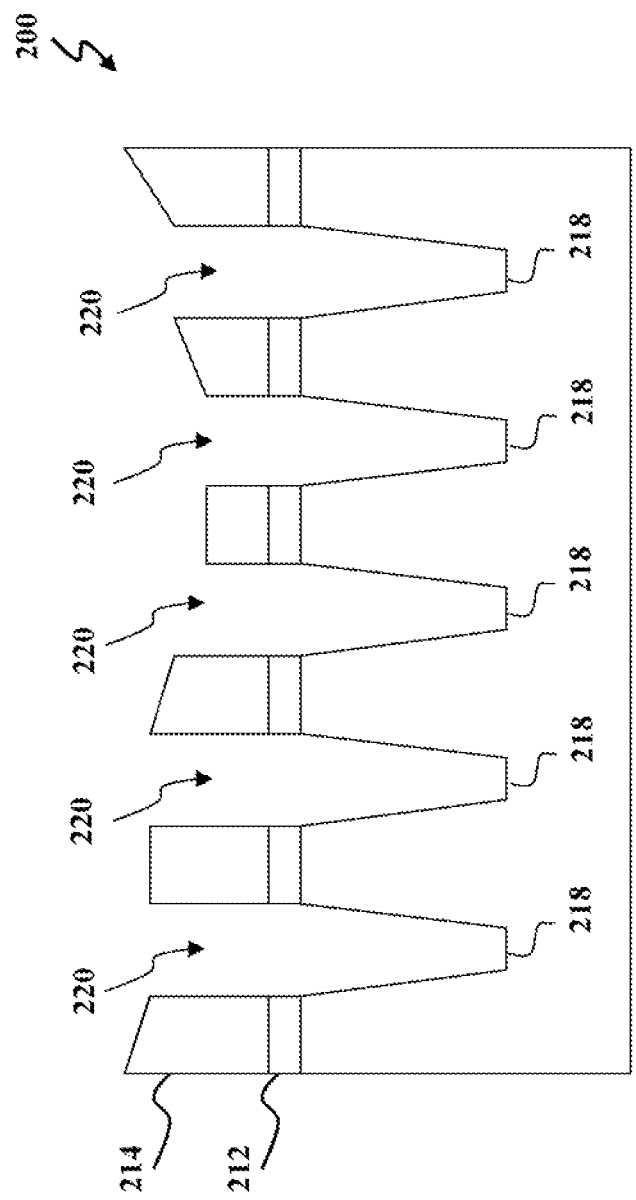

Referring to FIG. 3, trench isolation features 218 are formed in the substrate 210 for isolation. The trench isolation features 218 are formed by etching a plurality of trenches 220 in the substrate 210. In the present embodiment, the formation of the plurality of trenches 220 includes using the stop/hard mask layer 214 as a hard mask layer. A photolithography process and an etching process are used to pattern the stop/hard mask layer 214. An exemplary photolithography process may include photoresist patterning, etching, and photoresist stripping. The photoresist patterning may further include processing steps of photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint. The etching process may include a wet etching or dry etching process, or a combination thereof. The etching process uses the patterned stop/hard mask layer 214 to define the area to be etched and to protect other regions of the semiconductor device 200. In one example, a hydrofluoric acid (HF) or buffered HF may be used to etch the dielectric layer 212 to expose the substrate 210 within the openings defined by the stop/hard mask layer 214. In one example, a dry etching process used to etch the substrate 210 includes a chemistry including fluorine-containing gas. In furtherance of the example, the chemistry of the dry etch includes $CF_4$, $SF_6$, or $NF_3$.

As illustrated in FIG. 3, the use of the stop/hard mask layer 214 as a hard mask in the etching process may result in the stop/hard mask layer 214 having height variations and/or irregularities. Furthermore, the etching process may also result in the isolation regions 218 having height variations and/or irregularities. Certain two dimensional devices (2D) are insensitive to height variation and therefore, regardless of the variation, may benefit from the disclosed embodiment of method 100. The height variation, however, may adversely affect subsequent fabrication processing and the performance of certain devices. For example, FinFET devices are more sensitive to height variation because they are three dimensional devices (3D) having dependency on adjacent regions. When the adjacent region height varies, subsequent FinFET fabrication may be adversely affected. Furthermore, the height variation may also adversely affect performance of the completed FinFET device. As will be discussed further below, the height variation may be minimized or even eliminated by alternative embodiments. It is understood that different embodiments may have different advantages, and no particular advantage is necessarily required of any embodiment.

Figure 4:
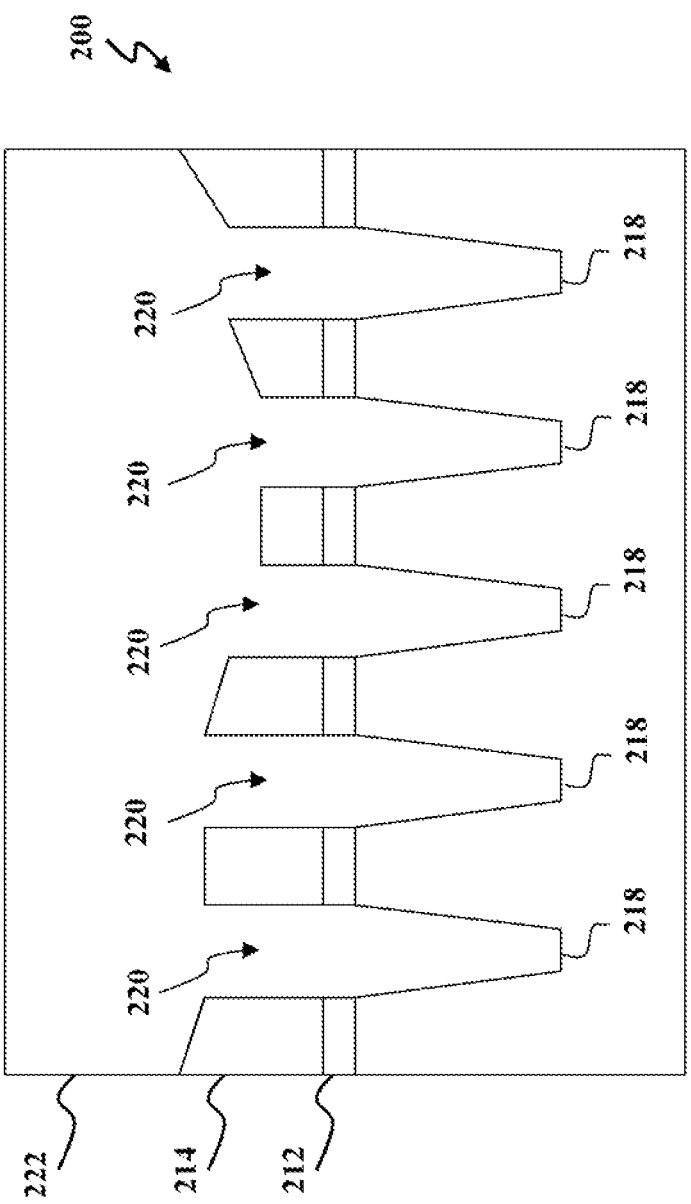

Referring to FIG. 4, each of the plurality of trenches 220 are filled with an isolation material 222. The isolation material 222 may include an insulating material such as silicon oxide, silicon nitride, silicon oxynitride, low k materials, air gap, other suitable material, or combinations thereof. In the present embodiment, the isolation material 222 includes silicon oxide. The silicon oxide can be deposited in the plurality of trenches 220 by a CVD process. In various examples, the silicon oxide can be formed by physical vapor deposition (PVD), atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner may be grown to improve the trench interface. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Figure 5:
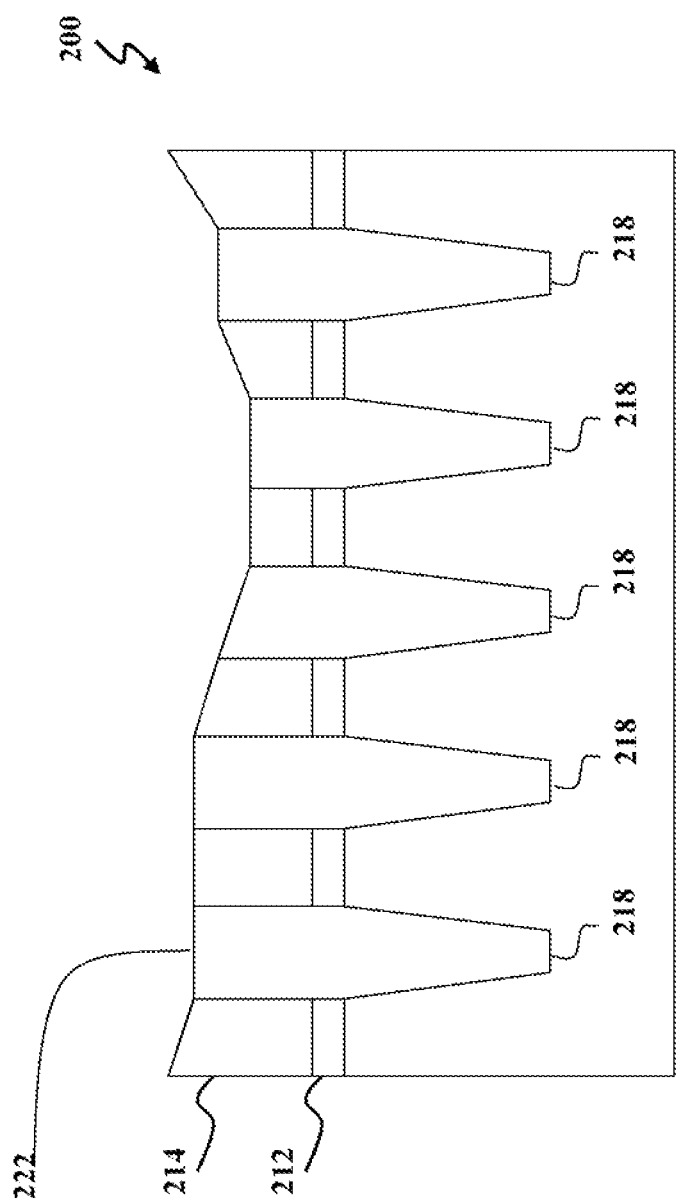

Referring to FIG. 5, a planarizing process is performed on the semiconductor device 200. In one embodiment, the planarizing process includes a chemical mechanical polishing (CMP) process applied to the substrate 210 to remove excessive portions of the trench-filling isolation material 222. The CMP process uses the stop/hard mask layer 214 as a polishing stop layer so that the CMP process can properly stop at the stop/hard mask layer 214.

Figure 6:
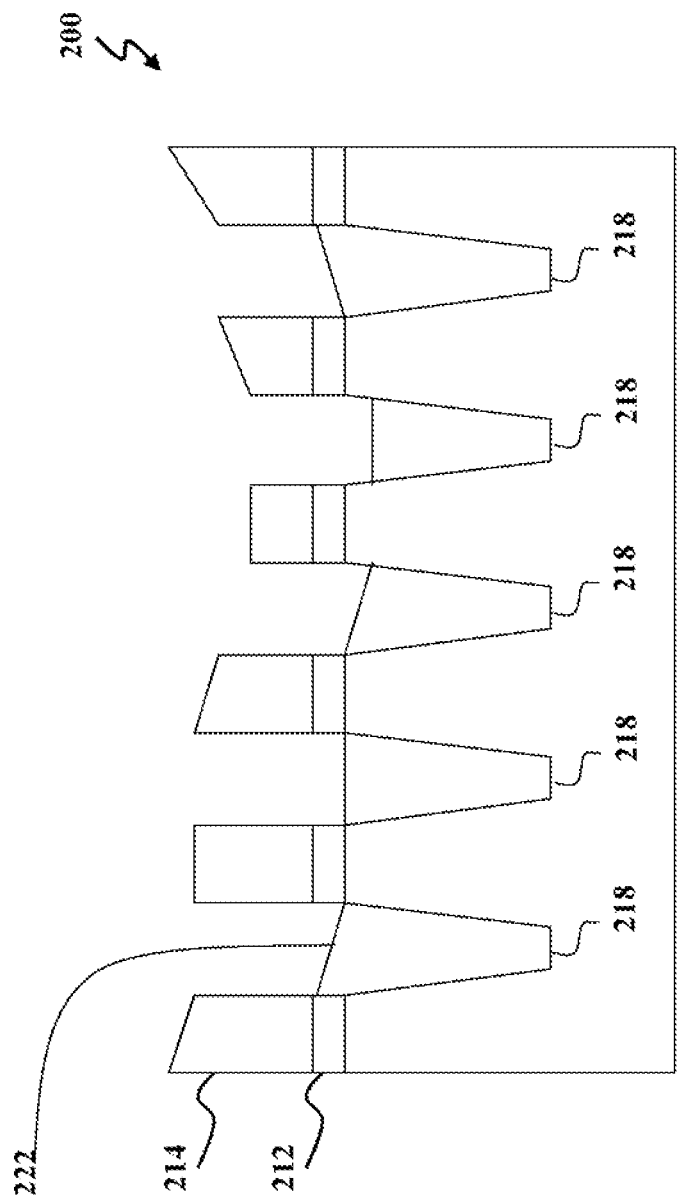

Referring to FIG. 6, an etching process is used to etch-back the excessive trench-filling isolation material 222. The etching process may include a wet etching or dry etching process. In one example, a dry etching process used to etch the isolation material includes a chemistry including fluorine-containing gas. In furtherance of the example, the chemistry of the dry etch includes $CF_4$, $SF_6$, or $NF_3$.

Figure 7:
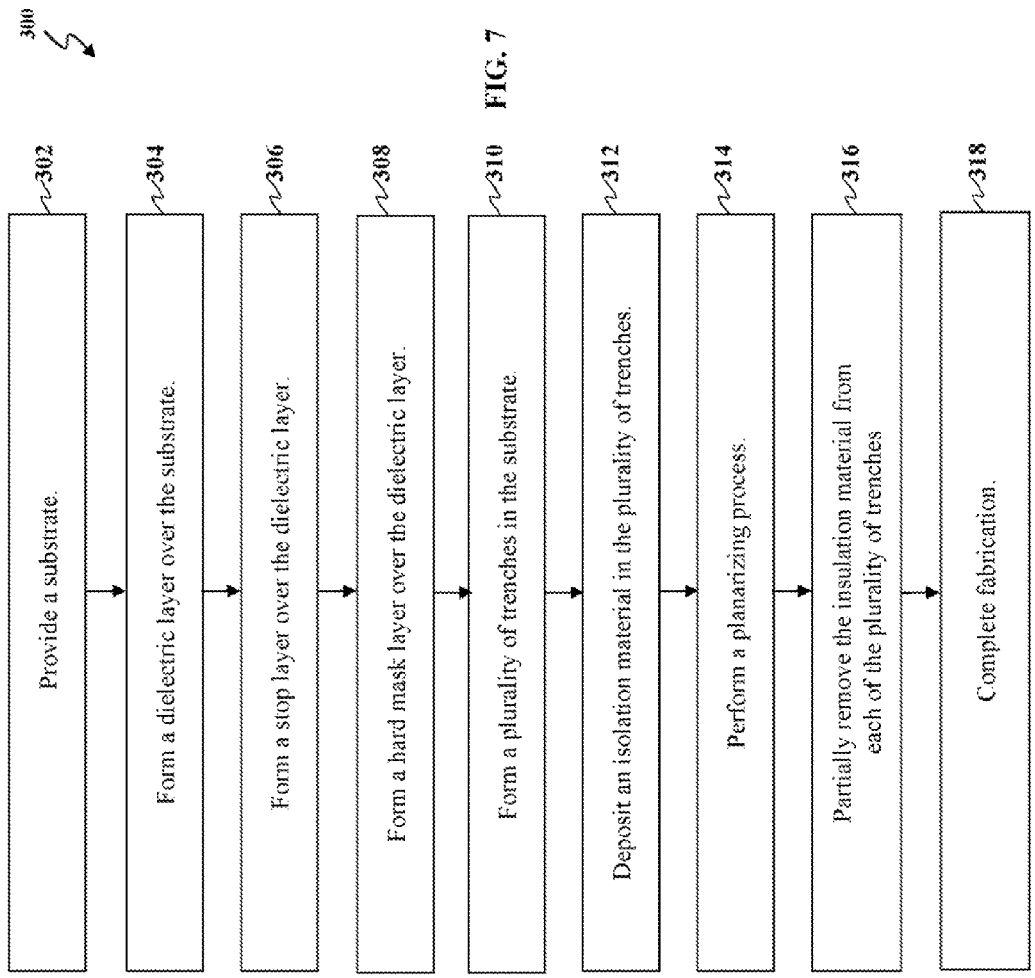
FIG. 7 is a flowchart illustrating a method of forming a semiconductor device according to various aspects of the present disclosure.

Referring to FIG. 7, a method 300 for fabricating a semiconductor device is described according to various aspects of the present disclosure. The embodiment of method 300 may include similar process steps as an embodiment of the method 100 which is disclosed above. In disclosing the embodiment of method 300, some details regarding processing and/or structure may be skipped for simplicity if they are similar to those described in the embodiment of method 100. The method 300 begins with step 302 in which a substrate is provided. The method 300 continues with step 304 in which a dielectric layer is formed over the substrate. At step 306, a stop layer is formed over the dielectric layer. At step 308, a hard mask layer is formed over the dielectric layer. The method 300 continues at step 310 in which a plurality of trenches are formed in the substrate. The method 300 continues at step 312 in which an isolation material is deposited in the plurality of trenches. At step 314, a planarizing process is performed. At step 316, the isolation material is partially removed from each of the plurality of trenches. The method 300 continues at step 318 in which fabrication of the integrated circuit device is completed. Additional steps can be provided before, during, and after the method 300, and some of the steps described can be replaced or eliminated for other embodiments of the method. The discussion that follows illustrates various embodiments of an integrated circuit device that can be fabricated according to the method 300 of FIG. 7.

FIGS. 8 to 12 illustrate diagrammatic cross-sectional side views of one embodiment of a semiconductor device 400 at various stages of fabrication according to the method 300 of FIG. 7. The semiconductor device 400 of FIGS. 8-12 is similar in certain respects to the semiconductor device 200 of FIGS. 2-6. Accordingly, similar features in FIGS. 2-6 and FIGS. 8-12 are identified by the same reference numerals for clarity and simplicity Referring to FIG. 8, the semiconductor device 400 includes a substrate 210. In the present embodiment, the substrate 210 defined in the semiconductor device 400 is substantially similar to the substrate 210 of the semiconductor device 200 in terms of composition, formation and configuration. In an alternative embodiment, they are different.

Figure 8:
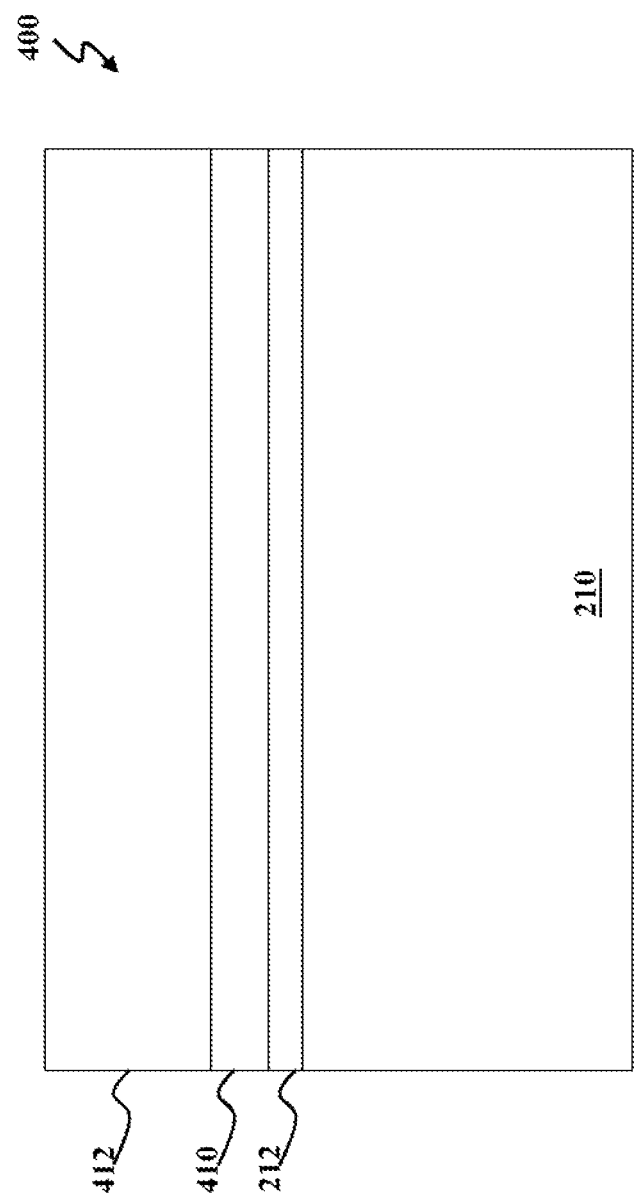
FIGS. 8 to 12 illustrate diagrammatic cross-sectional side views of one embodiment of a semiconductor device at various stages of fabrication according to the method of FIG. 7.

With further reference to FIG. 8, the semiconductor device 400 also includes a dielectric layer 212 formed over the substrate 210. In the present embodiment, the dielectric layer 212 defined in the semiconductor device 400 is substantially similar to the dielectric layer 212 of the semiconductor device 200 in terms of composition, formation and configuration. In an alternative embodiment, they are different. Formed over the dielectric layer 212 is a stop layer 410. The stop layer 410 is used as a polish stop layer in subsequent processes. The stop layer 410 is formed by any suitable process to any suitable thickness. For example, the stop layer 410 thickness may range from about 100 to about 500 Angstroms. The stop layer 410, for example, may include a material such as silicon oxide, silicon nitride, silicon oxynitride, silicon carbide, silicon carbon nitride, amorphous silicon, poly silicon, other suitable material, or combinations thereof. In the present embodiment, the stop layer 410 includes silicon nitride and is formed by a CVD process. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Still referring to FIG. 8, the semiconductor device 400 also includes a hard mask layer 412 formed over the stop layer 410. The hard mask layer 412 is formed by any suitable process to any suitable thickness. For example, the hard mask layer 412 may be formed having a thickness of about 100 to about 1500 Angstroms. The hard mask layer 412 includes a material such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In the present embodiment, the hard mask layer 412 includes silicon oxide and is formed by a CVD process. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis (TertiaryButylAmino) Silane (BTBAS or $C_8H_{22}N_2Si$) and Disilane (DS or $Si_2H_6$).

Figure 9:
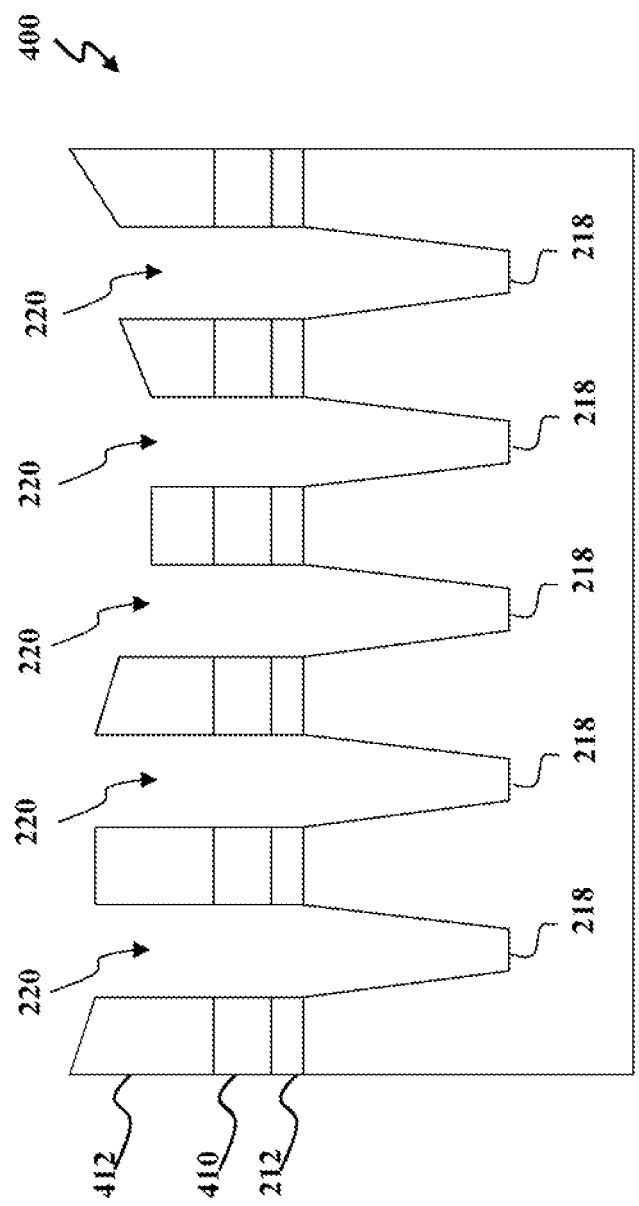

Referring to FIG. 9, trench isolation features 218 are formed in the substrate 210 for isolation. The trench isolation features 218 are formed by etching a plurality of trenches 220 in the substrate 210. In the present embodiment, the formation of the plurality of trenches 220 includes using the hard mask layer 412. A photolithography process and an etching process are used to pattern the hard mask layer 412. An exemplary photolithography process may include photoresist patterning, etching, and photoresist stripping. The photoresist patterning may further include processing steps of spacer patterning, photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint. The etching process may include a wet etching or dry etching process, or a combination thereof. The etching process uses the patterned hard mask layer 412 to define the area to be etched and to protect other regions of the semiconductor device 400. In one example, a wet etching process used to etch the stop layer 410 includes a chemistry including phosphoric acid ($H_3PO_4$) solution. In another example, a hydrofluoric acid (HF) or buffered HF may be used to etch the dielectric layer 212 to expose the substrate 210 within the openings defined by the hard mask layer 412. In one example, a dry etching process used to etch the substrate 210 includes a chemistry including fluorine-containing gas. In furtherance of the example, the chemistry of the dry etch includes $CF_4$, $SF_6$, or $NF_3$. In the present embodiment, a combination of wet/dry etching process are utilized. Depending on the design requirements, the above mentioned process steps may be repeated as necessary and may therefore include multiple patterning and etching steps.

As illustrated in FIG. 9, the use of the hard mask layer 412 in the etching process may result in height variations of the hard mask layer 412. These variations, however, will not effect the resulting device as the hard mask layer 412 is stripped away in subsequent processing. For example, as discussed below, one embodiment of method 300 provides for a CMP process which polishes away the hard mask layer 412 and thereby provides for a planarized finish. Furthermore, because CMP process provides a planarized finish, the isolation regions 218 will not have height variations and/or irregularities as compared to the method 100. The minimized variation, achieved by the disclosed method 300, may serve to reduce downstream fabrication issues and also provide more reliable device performance. Further, the method disclosed for achieving the semiconductor device described herein is easily implemented into current processing. It is understood that different embodiments may have different advantages, and no particular advantage is necessarily required of any embodiment.

Figure 10:
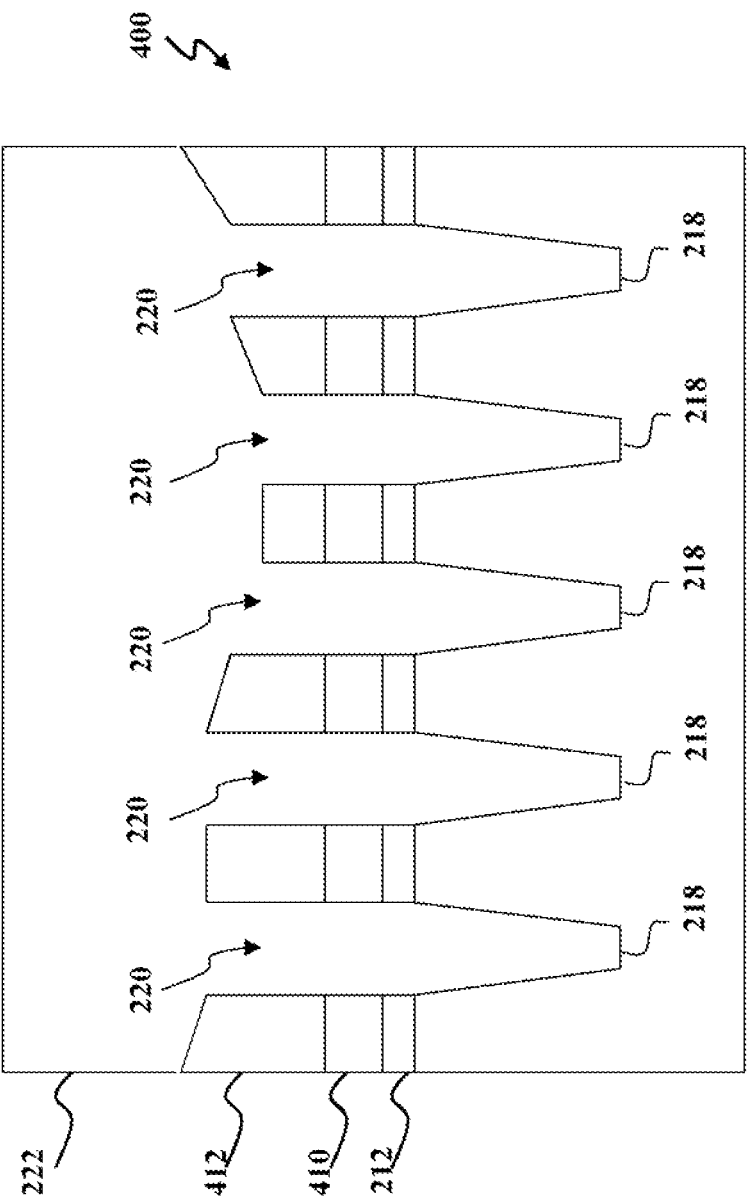

Referring to FIG. 10, the plurality of trenches 220 are filled with an isolation material 222. In the present embodiment, the isolation material 222 defined in the semiconductor device 400 is substantially similar to the isolation material 222 of the semiconductor device 200 in terms of composition, formation and configuration. In an alternative embodiment, they are different.

Figure 11:
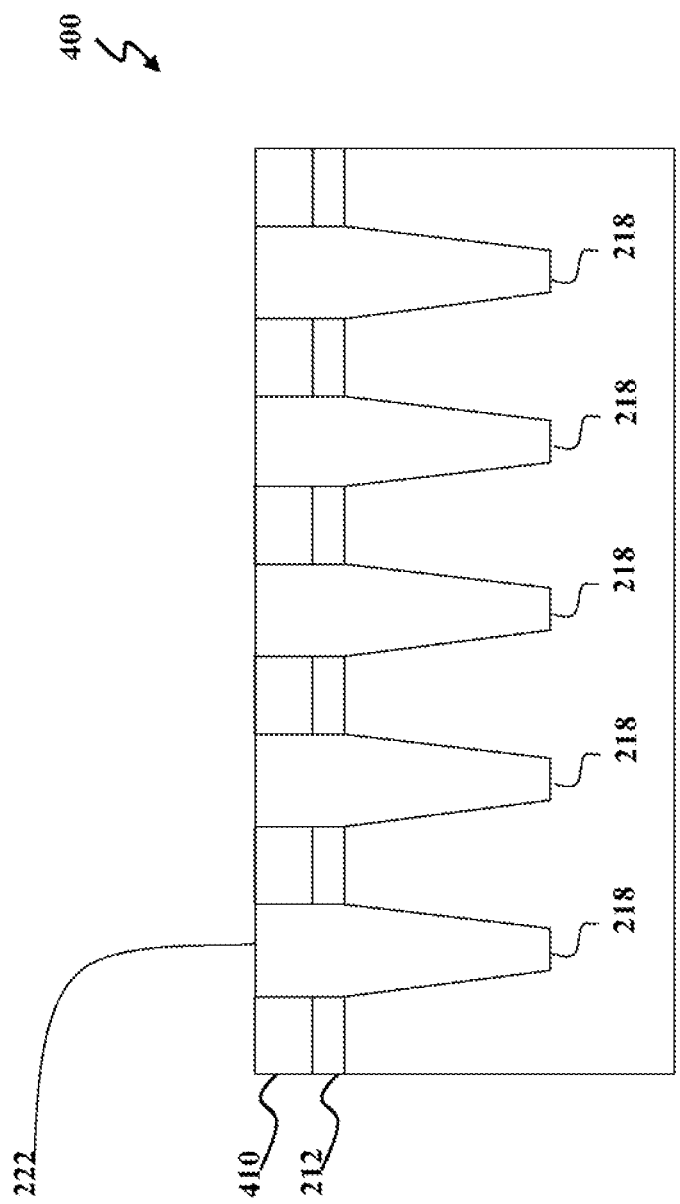

Referring to FIG. 11, a planarizing process is performed on the semiconductor device 400. In one embodiment, the planarizing process includes a chemical mechanical polishing (CMP) process applied to the substrate 210 to remove the hard mask layer 412 and excessive portions of the trench-filling isolation material 222. The CMP process uses the stop layer 410 as a polishing stop layer so that the CMP process can properly stop at the stop layer 410.

Figure 12:
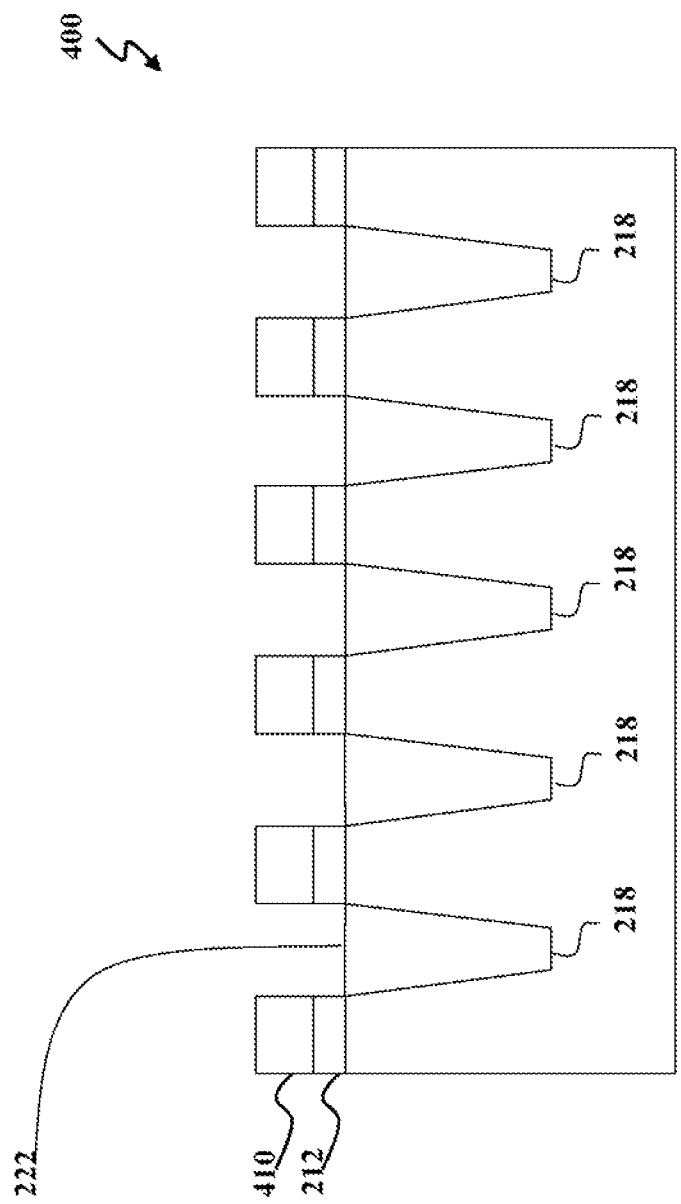

Referring to FIG. 12, an etching process is used to etch-back the excessive trench-filling isolation material 222. The etching process may include a wet etching or dry etching process. In one example, a dry etching process used to etch the isolation material includes a chemistry including fluorine-containing gas. In furtherance of the example, the chemistry of the dry etch includes $CF_4$, $SF_6$, or $NF_3$.

Figure 13:
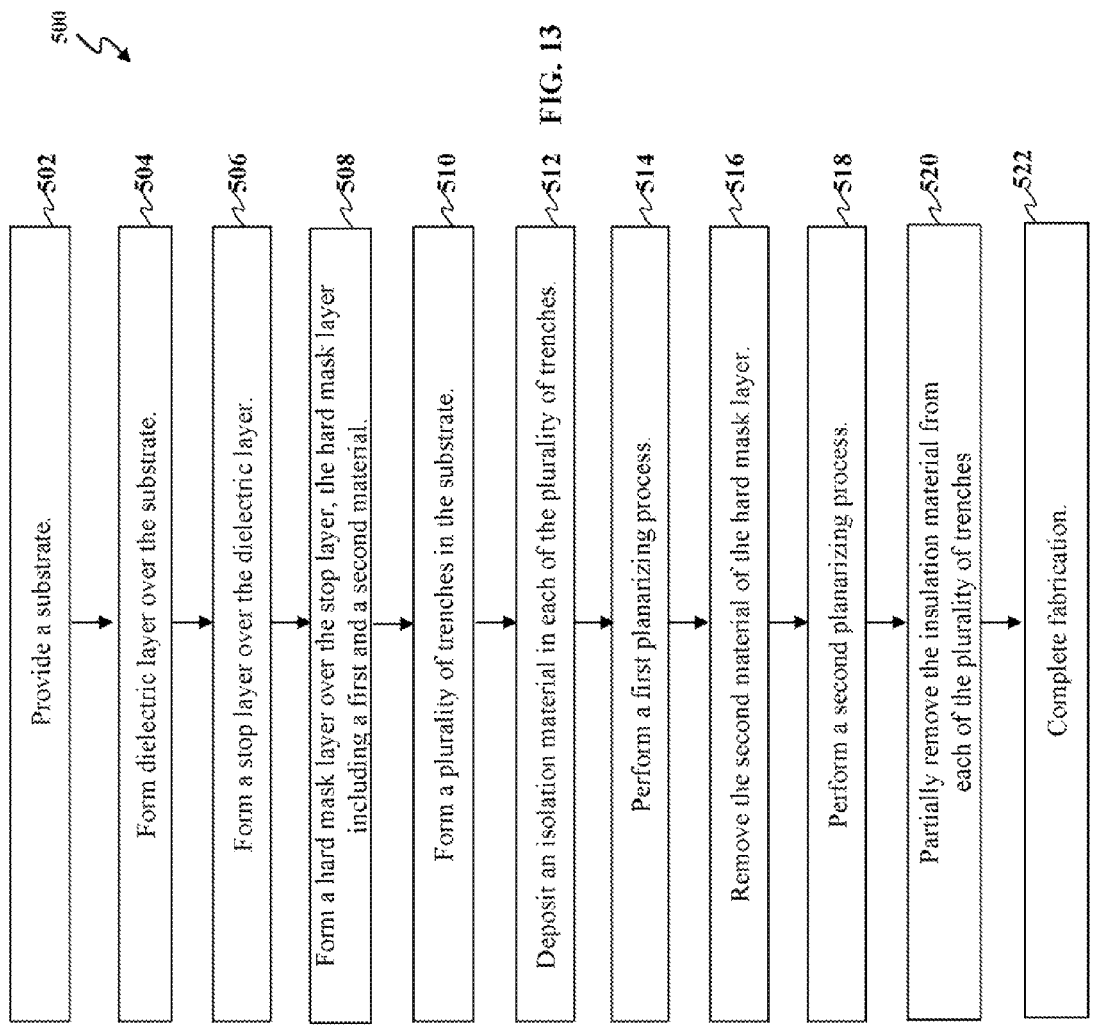
FIG. 13 is a flowchart illustrating a method of forming a semiconductor device according to various aspects of the present disclosure.

Referring to FIG. 13, a method 500 for fabricating a semiconductor device is described according to various aspects of the present disclosure. The embodiment of method 500 may include similar process steps as an embodiment of the method 100 which is disclosed above. In disclosing the embodiment of method 500, some details regarding processing and/or structure may be skipped for simplicity if they are similar to those described in the embodiment of method 100. The method 500 begins with step 502 in which a substrate is provided. The method 500 continues with step 504 in which a dielectric layer is formed over the substrate. At step 506, a stop layer is formed over the dielectric layer. At step 508, a hard mask layer is formed over the stop layer. The hard mask layer includes a first and a second material. The method 500 continues at step 510 in which a plurality of trenches are formed in each of the substrate. The method 500 continues at step 512 in which an isolation material is deposited in each of the plurality of trenches. At step 514, a first planarizing process is performed. At step 516, the second material of the hard mask layer is removed. The method 500 may include an optional second isolation material deposition step after the removal of the second material of the hard mask layer. At step 518, a second planarizing process is performed. At step 520, the isolation material is partially removed from each of the plurality of trenches. The method 500 continues at step 522 in which fabrication of the integrated circuit device is completed. Additional steps can be provided before, during, and after the method 500, and some of the steps described can be replaced or eliminated for other embodiments of the method. The discussion that follows illustrates various embodiments of an integrated circuit device that can be fabricated according to the method 500 of FIG. 13.

FIGS. 14 to 20 illustrate diagrammatic cross-sectional side views of one embodiment of a semiconductor device 600 at various stages of fabrication according to the method 500 of FIG. 13. The semiconductor device 600 of FIGS. 14-20 is similar in certain respects to the semiconductor device of FIGS. 2-6. Accordingly, similar features in FIGS. 2-6 and FIGS. 14-20 are identified by the same reference numerals for clarity and simplicity.

Figure 14:
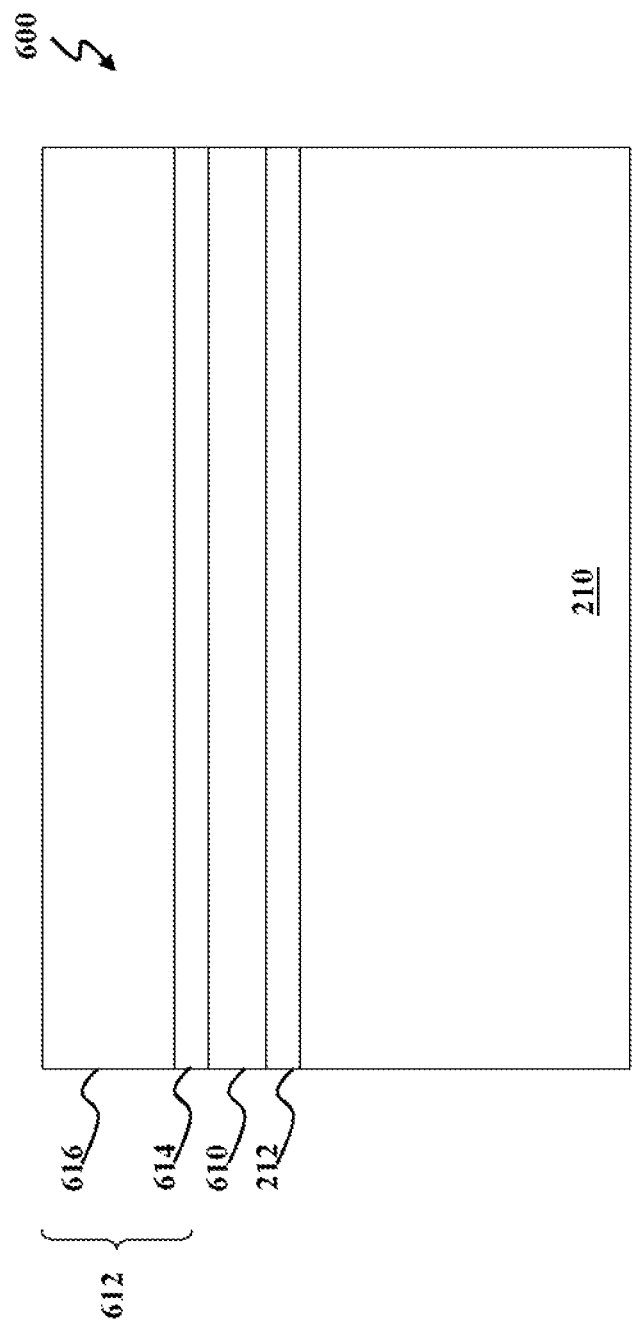
FIGS. 14 to 20 illustrate diagrammatic cross-sectional side views of one embodiment of a semiconductor device at various stages of fabrication according to the method of FIG. 13.

Referring to FIG. 14, the semiconductor device 600 includes a substrate 210. In the present embodiment, the substrate 210 defined in the semiconductor device 600 is substantially similar to the substrate 210 of the semiconductor device 200 in terms of composition, formation and configuration. In an alternative embodiment, they are different.

With further reference to FIG. 14, the semiconductor device 600 also includes a dielectric layer 212 formed over the substrate 210. In the present embodiment, the dielectric layer 212 defined in the semiconductor device 600 is substantially similar to the dielectric layer 212 of the semiconductor device 200 in terms of composition, formation and configuration. In an alternative embodiment, they are different.

Formed over the dielectric layer 212 is a stop layer 610. The stop layer 610 is used as a polish stop layer in subsequent processes. The stop layer 610 is formed by any suitable process to any suitable thickness. For example, the stop layer 610 thickness may range from about 100 to about 500 Angstroms. The stop layer 610 may include a material such as silicon oxide, silicon nitride, silicon oxynitride, silicon carbide, silicon carbon nitride, amorphous silicon, poly silicon, other suitable material, or combinations thereof. In the present embodiment, the stop layer 610 includes silicon nitride and is formed by a CVD process. In various examples, the silicon nitride can be formed physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Still referring to FIG. 14, the semiconductor device 600 also includes a hard mask layer 612 formed over the stop layer 610. The hard mask layer 612 is formed by any suitable process to any suitable thickness. For example, the hard mask layer 612 may be formed having a thickness greater than about 100 Angstroms. The hard mask layer 612 has one or more suitable dielectric materials. For example, in the present embodiment, the hard mask layer 612 includes a first dielectric layer 614 formed on the stop layer 610 and a second dielectric layer 616 formed on the first layer 614. The first dielectric layer 614 includes a material such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In the present embodiment, the first dielectric layer 614 includes silicon oxide and is formed by a CVD process. The second dielectric layer 616 may include a material such as silicon oxide, silicon nitride, silicon oxynitride, silicon carbide, silicon carbon nitride, amorphous silicon, poly silicon, other suitable material, or combinations thereof. In the present embodiment, the second dielectric layer 616 includes silicon nitride and is formed by a CVD process. In various examples, the hard mask layer 612 can be formed physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 15:
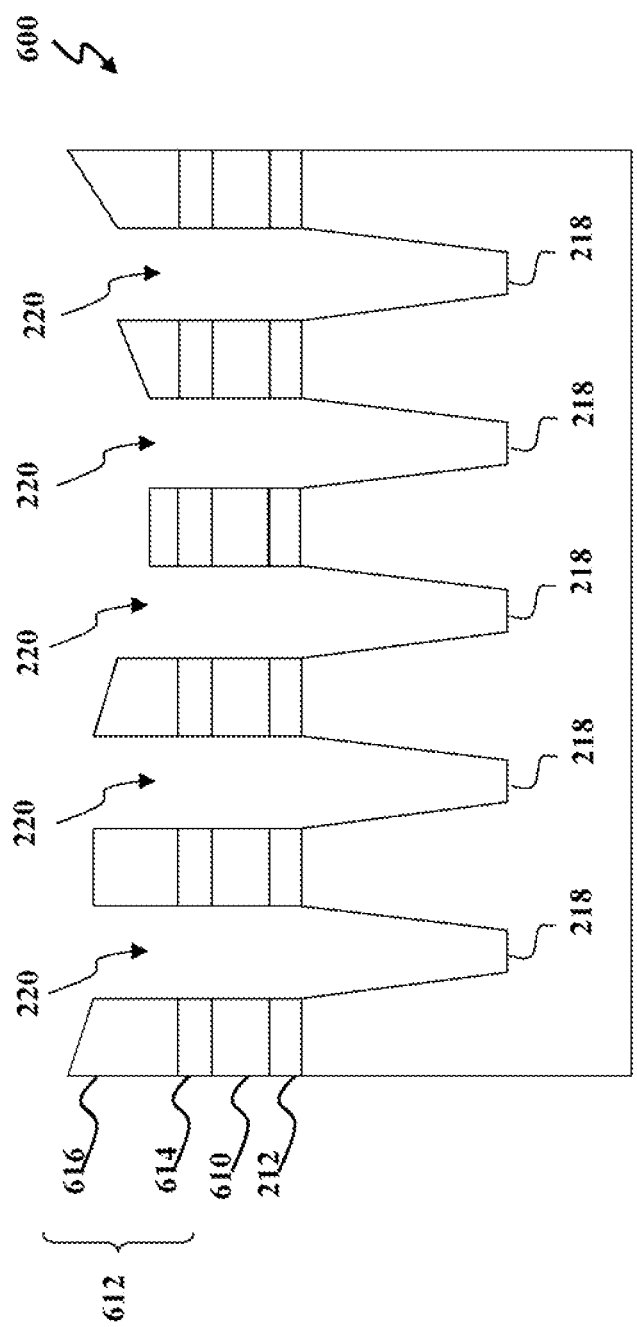

Referring to FIG. 15, trench isolation features 218 are formed in the substrate 210 for isolation. The trench isolation features 218 are formed by etching a plurality of trenches 220 in the substrate 210. In the present embodiment, the formation of the plurality of trenches 220 includes using the second dielectric layer 616 of the hard mask layer 612. A photolithography process and an etching process are used to pattern the second dielectric layer 616. An exemplary photolithography process may include spacer patterning, photoresist patterning, etching, and photoresist stripping. The photoresist patterning may further include processing steps of photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint. The etching process may include a wet etching or dry etching process, or a combination thereof. The etching process uses the patterned second dielectric layer 616 to define the area to be etched and to protect other regions of the semiconductor device 400. In one example, a wet etching process used to etch the stop layer 610 includes a chemistry including phosphoric acid (H3PO4) solution. In another example, a hydrofluoric acid (HF) or buffered HF may be used to etch the second dielectric layer 614 and the dielectric layer 212 to expose the substrate 210 within the openings defined by the patterned second dielectric layer 616 of the hard mask layer 612. In one example, a dry etching process used to etch the substrate 210 includes a chemistry including fluorine-containing gas. In furtherance of the example, the chemistry of the dry etch includes $CF_4$, $SF_6$, or $NF_3$. In the present embodiment, a combination of wet/dry etching processes are utilized. Depending on the design requirements, the above mentioned process steps may be repeated as necessary and may therefore include multiple patterning and etching steps.

Figure 16:
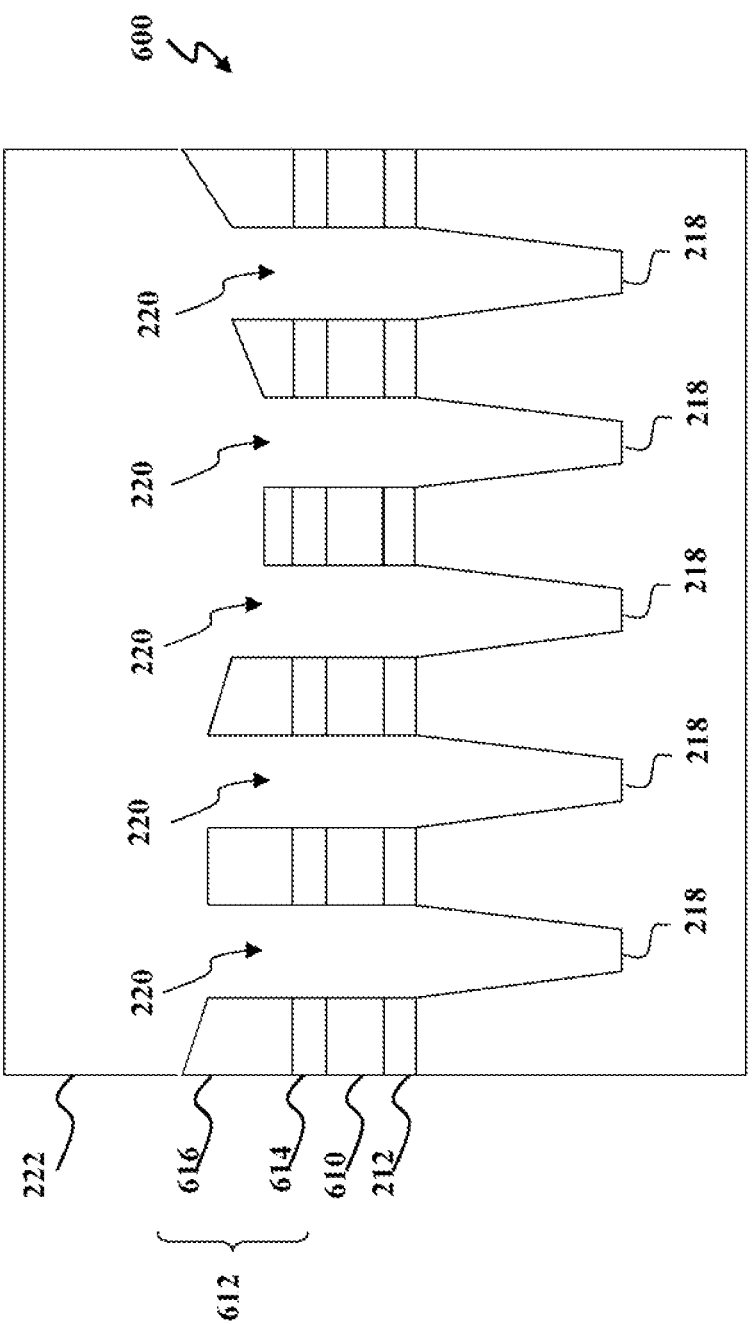

As illustrated in FIG. 16, the use of the second dielectric layer 616 of the hard mask layer 612 in the etching process may result in height variations of the second dielectric layer 616. Although not illustrated, the etching process may also result in height variations in the first dielectric layer 614 of the hard mask layer 612. These variations, however, will not effect the resulting device as the first dielectric layer 614 and the second dielectric layer 616 of the hard mask layer 612 are removed in subsequent processing. For example, as discussed below, one embodiment of method 500 provides for an etching process which removes the second dielectric layer 616 and a CMP process which removes the first dielectric layer 614, thereby forming a substantially planarized device. Furthermore, because CMP process provides a planarized finish, the isolation regions 218 will not have height variations and/or irregularities as compared to the method 100. The minimized variation, achieved by the disclosed method 500, may serve to reduce downstream fabrication issues and also provide more reliable device performance. Further, the method disclosed for achieving the semiconductor device described herein is easily implemented into current processing. It is understood that different embodiments may have different advantages, and no particular advantage is necessarily required of any embodiment.

Referring to FIG. 16, the plurality of trenches 220 are filled with an isolation material 222. In the present embodiment, the isolation material 222 defined in the semiconductor device 600 is substantially similar to the isolation material 222 of the semiconductor device 200 in terms of composition, formation and configuration. In an alternative embodiment, they are different.

Figure 17:
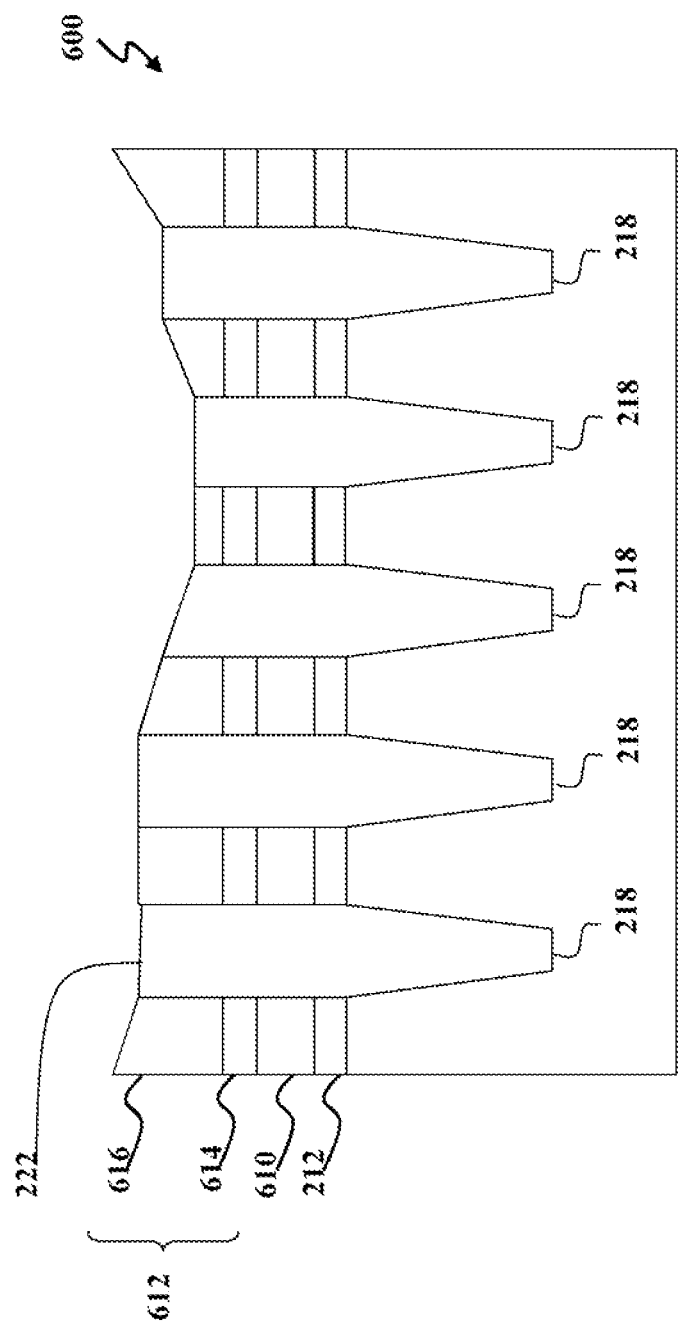

Referring to FIG. 17, a planarizing process is performed on the semiconductor device 600. In one embodiment, the planarizing process includes a chemical mechanical polishing (CMP) process applied to the substrate 210 to remove excessive portions of the trench-filling isolation material 222. The CMP process uses the second dielectric layer 616 of the hard mask layer 612 as a polishing stop layer so that the CMP process can properly stop at the hard mask layer 612.

Figure 18:
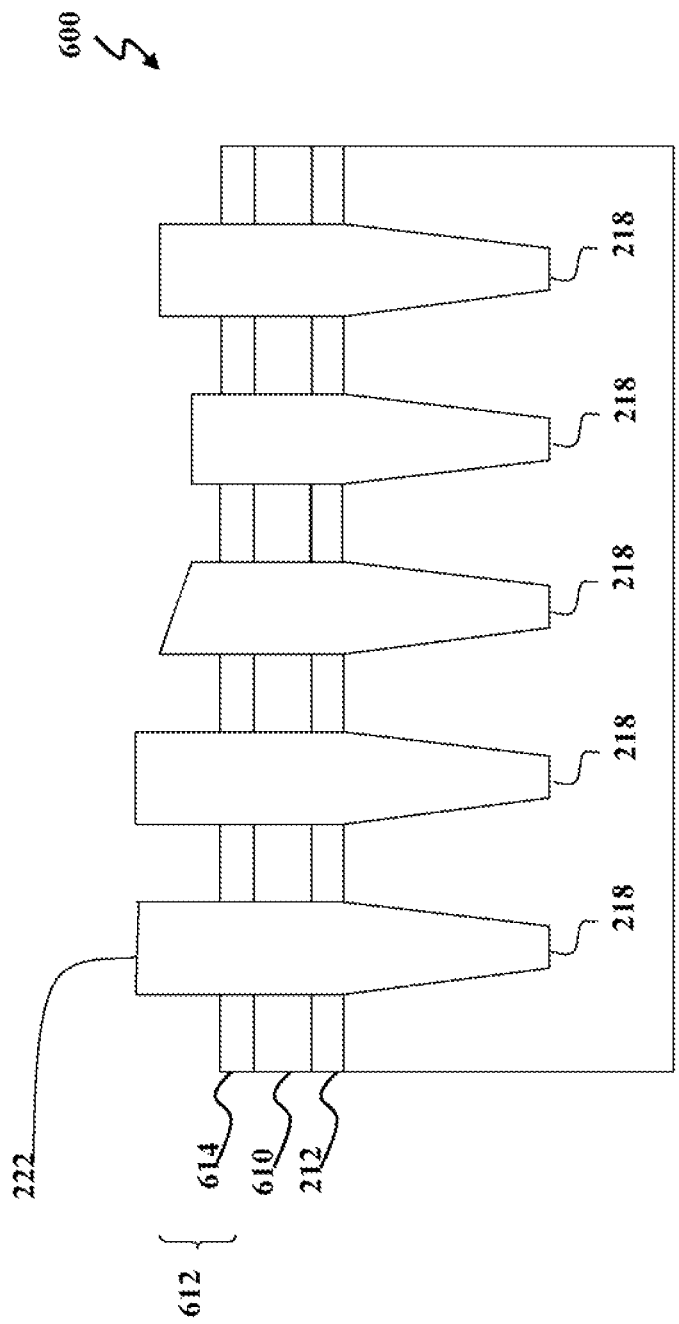

Referring to FIG. 18, an etching process is performed to remove the second dielectric layer 616 of the hard mask layer 612. The etching process may include a wet etching or dry etching process. In one example, a wet etching process used to etch away the second dielectric layer 616 includes a chemistry including phosphoric acid (H3PO4) solution. After the etching process, in certain embodiments, a second isolation material may deposited over the semiconductor device 600. The second isolation material, for example, may include materials substantially similar to the isolation material 222.

Figure 19:
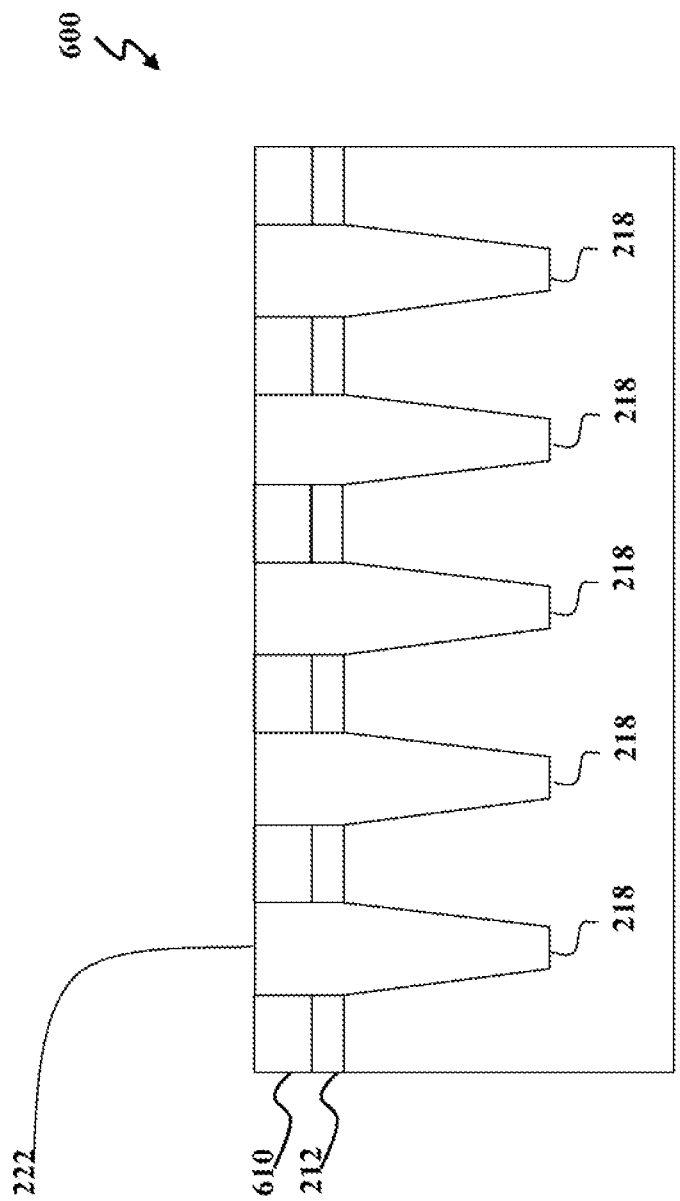

Referring to FIG. 19, a planarizing process is performed on the semiconductor device 600. In one embodiment, the planarizing process includes a chemical mechanical polishing (CMP) process applied to the substrate 210 to remove excessive portions of the trench-filling isolation material 222 and to remove the first dielectric material 614 of the hard mask layer 612. The CMP process uses the stop layer 610 as a polishing stop layer so that the CMP process can properly stop at the stop layer 610.

Figure 20:
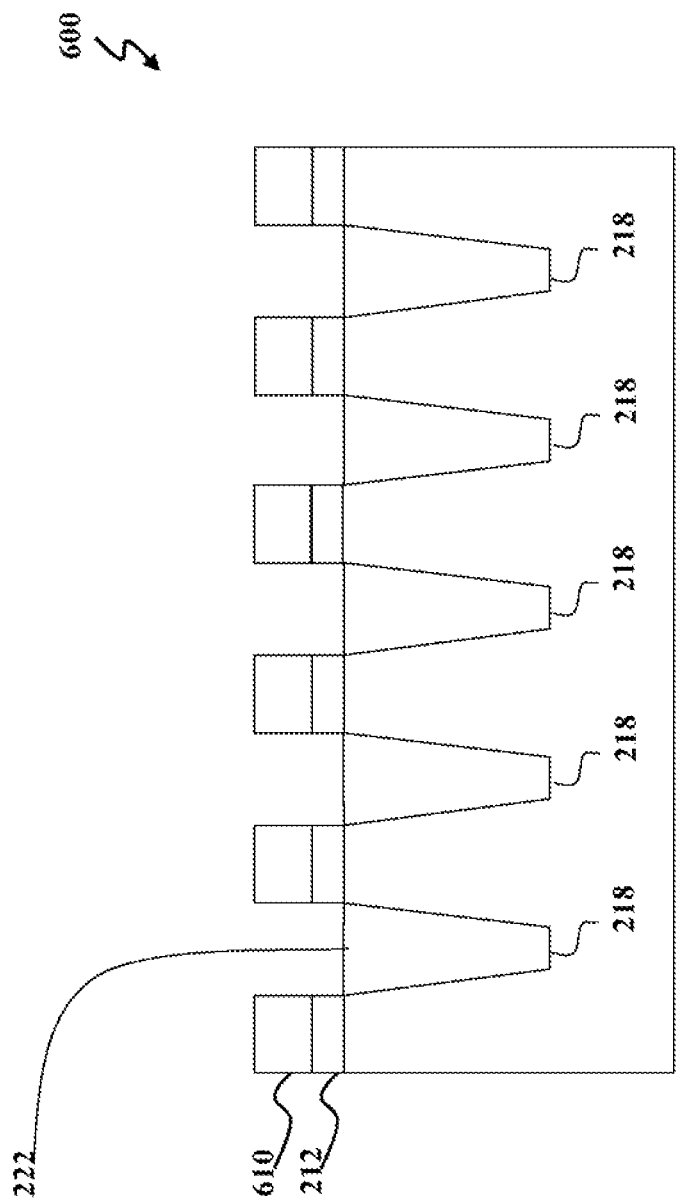

Referring to FIG. 20, an etching process is used to etch-back the excessive trench-filling isolation material 222. The etching process may include a wet etching or dry etching process. In one example, a dry etching process used to etch the isolation material includes a chemistry including fluorine-containing gas. In furtherance of the example, the chemistry of the dry etch includes $CF_4$, $SF_6$, or $NF_3$.

Examples of devices that can benefit from one or more embodiments of the present invention are semiconductor devices with field effect transistors (FET). Such a device, for example, may include metal-oxide-semiconductor field effect transistors (MOSFETs), complementary metal-oxide-semiconductor (CMOS) transistors, fin-like field effect transistors (FinFETs), high voltage transistors, and/or high frequency transistors; other suitable components; and/or combinations thereof. The semiconductor device may additionally include passive components, such as resistors, capacitors, inductors, and/or fuses. It is understood that certain features of the semiconductor device may be formed by well known technology processing, and thus some processes are not described in detail herein.

For example, the semiconductor device 200, 400, and 600 may be included in subsequent processing to form a FinFET device. The FinFET device may include additional features, which may be formed by subsequent processing. For example, subsequent processing may further form various contacts/vias/lines and multilayer interconnect features (e.g., metal layers and interlayer dielectrics) on the substrate, configured to connect the various features or structures of the FinFET device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structures. In another embodiment, tungsten is used to form tungsten plugs in the contact holes.

The disclosed semiconductor device 200, 400, and 600 may also be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

Thus, provided is a method to manufacture a semiconductor device. The method includes providing a substrate. A dielectric layer is formed over the semiconductor substrate and a stop layer is formed over the dielectric layer. The stop layer and the dielectric layer comprise a different material. The method further includes forming a patterned hard mask layer over the stop layer and etching the semiconductor substrate through the patterned hard mask layer to form a plurality of trenches. The method also includes depositing an isolation material on the semiconductor substrate and substantially filling the plurality of trenches. Thereafter, performing a CMP process on the semiconductor substrate, wherein the CMP process stops on the stop layer. The method may further comprise partially removing the isolation material within the plurality of trenches. The stop layer and the hard mask layer may include a different material and the hard mask layer and the isolation material may include the same material. The dielectric layer may include silicon oxide. The stop layer may include silicon nitride. The hard mask layer may include silicon oxide. The isolation material may include silicon oxide.

Also provided is an alternative embodiment of a method for manufacturing a semiconductor device. The method includes providing a semiconductor substrate and forming a dielectric layer over the semiconductor substrate. The method further includes forming a stop layer over the dielectric layer and forming a hard mask layer over the stop layer, wherein the hard mask layer comprises a first material layer and a second material layer, the first material layer being formed over the stop layer and the second material layer being formed over the first material layer, and wherein the first material layer and the second material layer comprise a different material. Further, the method includes forming a plurality of trenches in the semiconductor substrate and depositing an isolation material on the semiconductor substrate and substantially filling the plurality of trenches. Thereafter, the method includes performing a first CMP process on the semiconductor substrate; removing the second material layer of the hard mask layer; and performing a second CMP process on the semiconductor substrate.

The method may further comprise after removing the second material layer of the hard mask layer and before performing the second CMP process, forming another isolation material over the semiconductor substrate; and after performing a second CMP process, partially removing the isolation material within the plurality of trenches. The stop layer and the dielectric layer may comprise a different material. The first CMP may process stop on the second material layer of the hard mask layer and the second CMP process may stop on the stop layer. The first material layer of the hard mask layer may include silicon oxide, and the second material layer of the hard mask layer may include silicon nitride. Removing the second material layer of the hard mask layer may include performing a wet etching process. The plurality of trenches may be formed by an etching process. The dielectric layer may include silicon oxide and the stop layer may include silicon nitride. The isolation material and the another isolation material may include silicon oxide.

Also provided is yet another alternative embodiment of a method for manufacturing a semiconductor device. The method includes providing a semiconductor substrate and depositing a dielectric layer over the semiconductor substrate. The method further includes depositing a silicon nitride layer over the dielectric layer and depositing a silicon oxide layer over the silicon nitride layer. Thereafter, the method includes, forming a plurality of isolation features in the semiconductor substrate, wherein forming the plurality of isolation features includes forming a plurality of trenches and depositing a trench-filling silicon oxide material over the semiconductor device and substantially filling each of the plurality of trenches. Thereafter, the method includes, planarizing the semiconductor device by a CMP process that stops on the silicon nitride layer, wherein the CMP process removes the trench-filling silicon oxide material disposed over the semiconductor device. Thereafter, the method includes, partially removing the trench-filling silicon oxide material within each of the plurality of trenches. Forming the plurality of trenches may include a dry etching process. Depositing a trench-filling silicon oxide material may include a CVD process. And, partially removing the trench-filling silicon oxide material may include a dry etching process.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a semiconductor substrate;
   forming a stop layer over and in physical contact with the dielectric layer, wherein the stop layer and the dielectric layer comprise a different material;
   forming a patterned hard mask layer over the stop layer;
   etching the semiconductor substrate through the patterned hard mask layer to form a plurality of trenches;
   depositing an isolation material on the semiconductor substrate and substantially filling the plurality of trenches; and
   performing a planarizing process on the semiconductor substrate thereby removing at least a portion of the patterned hard mask layer and at least a portion of the isolation material, wherein the planarizing process stops on the stop layer, and
   partially removing the isolation material within the plurality of trenches such that a top most surface of the isolation material is below a top most surface of the dielectric layer.

2. The method of claim 1 wherein the stop layer and the hard mask layer include a different material, and wherein the hard mask layer and the isolation material include the same material.

3. The method of claim 1 wherein the dielectric layer includes silicon oxide.

4. The method of claim 1 wherein the stop layer includes silicon nitride.

5. The method of claim 1 wherein the hard mask layer includes silicon oxide.

6. The method of claim 1 wherein the isolation material includes silicon oxide.

7. A method of forming a semiconductor device, comprising:
providing a semiconductor substrate;
forming a dielectric layer over the semiconductor substrate;
forming a stop layer over the dielectric layer;
forming a hard mask layer over the stop layer, wherein the hard mask layer comprises a first material layer and a second material layer, the first material layer being formed over the stop layer and the second material layer being formed over the first material layer, and wherein the first material layer and the second material layer comprise a different material;
forming a plurality of trenches in the semiconductor substrate using the hard mask layer to define the area to be trenched;
depositing an isolation material on the semiconductor substrate and substantially filling the plurality of trenches;
thereafter, performing a first CMP process on the semiconductor device;
thereafter, removing the second material layer of the hard mask layer; and
thereafter, performing a second CMP process on the semiconductor device.

8. The method of claim 7 further comprising:
after removing the second material layer of the hard mask layer and before performing the second CMP process, forming another isolation material over the semiconductor substrate; and
after performing a second CMP process, partially removing the isolation material within the plurality of trenches.

9. The method of claim 7 wherein the stop layer and the dielectric layer comprise a different material.

10. The method of claim 7 wherein the first CMP process stops on the second material layer of the hard mask layer.

11. The method of claim 7 wherein the second CMP process stops on the stop layer.

12. The method of claim 7 wherein the first material layer of the hard mask layer comprises silicon oxide, and wherein the second material layer of the hard mask layer comprises silicon nitride.

13. The method of claim 7 wherein removing the second material layer of the hard mask layer includes performing a wet etching process.

14. The method of claim 7 wherein the plurality of trenches are formed by an etching process.

15. The method of claim 7 wherein the dielectric layer comprises silicon oxide.

16. The method of claim 7 wherein the stop layer comprises silicon nitride.

17. The method of claim 8 wherein the isolation material and the another isolation material comprise silicon oxide.

18. A method of forming a semiconductor device, comprising:
depositing a dielectric layer over a semiconductor substrate;
depositing a silicon nitride layer over the dielectric layer;
depositing a silicon oxide layer over the silicon nitride layer;
forming a plurality of isolation features in the semiconductor substrate, wherein forming the plurality of isolation features includes forming a plurality of trenches using the silicon oxide layer as a mask layer, and wherein forming the plurality of isolation features further includes depositing a trench-filling silicon oxide material over the semiconductor device and substantially filling the plurality of trenches;
performing a planarizing process that stops on the silicon nitride layer, wherein the planarizing process removes at least a portion of the silicon oxide layer and at least a portion of the trench-filling silicon oxide material disposed over the semiconductor device; and
partially removing at least a portion of the trench-filling silicon oxide material within the plurality of trenches such that a top most surface of the silicon oxide material is below a top most surface of the dielectric layer.

19. The method of claim 18 wherein forming the plurality of trenches includes a dry etching process,
wherein the planarizing process includes a CMP process,
wherein depositing a trench-filling silicon oxide material includes a CVD process, and
wherein partially removing the trench-filling silicon oxide material includes a dry etching process.

* * * * *